United States Patent
Roozen et al.

(10) Patent No.: US 6,549,010 B2
(45) Date of Patent: Apr. 15, 2003

(54) MRI APPARATUS WITH A PIEZO ACTUATOR IN A NON-RIGID SUSPENSION OF THE GRADIENT COIL CARRIER

(75) Inventors: Nicolaas Bernardus Roozen, Eindhoven (NL); Gerard Van Schothorst, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/012,022

(22) Filed: Dec. 5, 2001

(65) Prior Publication Data

US 2002/0079895 A1 Jun. 27, 2002

(30) Foreign Application Priority Data

Dec. 5, 2000 (EP) .............................. 00204344

(51) Int. Cl.$^7$ ................................. G01V 3/00
(52) U.S. Cl. ....................... 324/318; 324/322
(58) Field of Search ................ 324/318, 322, 324/300, 306, 307, 309, 312, 314

(56) References Cited

U.S. PATENT DOCUMENTS

| | | | | |
|---|---|---|---|---|
| 5,345,177 A | * | 9/1994 | Sato et al. | 324/318 |
| 5,793,210 A | | 8/1998 | Pla et al. | 324/318 |
| 6,353,319 B1 | * | 3/2002 | Dietz et al. | 324/318 |
| 6,396,272 B1 | * | 5/2002 | Dietz et al. | 324/309 |

* cited by examiner

Primary Examiner—Louis Arana
(74) Attorney, Agent, or Firm—John Vodopia

(57) ABSTRACT

Vibrations of the gradient coil carrier (18) medical MRI apparatus should be counteracted because they give rise to disturbing noise and macroscopic movements that deteriorate the image quality. In accordance with the invention the gradient coil system is suspended by means of weak resilient suspension elements (22) that are connected in series with piezo actuators (21). The actuators are controlled in such a way that macroscopic movements at low-frequency vibrations (order of magnitude of 10 Hz) that are due to the very resilient suspension are counteracted, and also that the high-frequency vibrations (order of magnitude of 700 Hz) that result from internal Lorentz forces are hardly transferred to the frame of the apparatus.

8 Claims, 6 Drawing Sheets

MRI APPARATUS WITH A PIEZO ACTUATOR IN A NON-RIGID SUSPENSION OF THE GRADIENT COIL CARRIER

BACKGROUND OF THE INVENTION

The invention relates to an apparatus for forming magnetic resonance images, which apparatus includes a gradient coil system that includes a gradient coil carrier on which gradient coils are arranged, said gradient coil carrier being attached to a frame of the apparatus by way of suspension elements, each of which is provided with a resilient element.

An apparatus of this kind is known from U.S. Pat. No. 5,793,210. The MRI apparatus that is described in the cited document is provided with a gradient coil system with gradient coils that are arranged in an enclosure in which the gas pressure is lower than that of the ambient atmosphere. Coils of this kind may be arranged on a gradient coil carrier which itself is attached to further parts of the MRI apparatus; the gradient coil carrier is attached notably to the frame of the MRI apparatus by way of suspension elements.

It is a generally known fact that gradient coils in operation produce noise that is very annoying to the patients to be examined. Therefore, the technical aim is to reduce this noise as much as possible. To this end, the gradient coils in the known MRI apparatus are arranged in a vacuum atmosphere with a residual pressure such that the acoustic transfer of vibrations, arising in the gradient, to the surroundings via said residual atmosphere is strongly reduced. Said vacuum space may be filled with a noise absorbing fiber glass material so as to reduce the residual transfer via the atmosphere even further. In order to counteract the transfer of vibrations via the suspension elements, the suspension elements are arranged so as to mitigate the transfer of vibrations that are generated by the gradient coil system. The gradient coil system is supported notably by materials that form part of the suspension elements and have the desired acoustic properties, for example rubber, plastic or an epoxy material, or by resilient elements that, like said materials, bear on rigid structural elements such as supports or flanges that are especially provided for this purpose.

It is known per se that the transfer of vibrations from a vibrating element to its surroundings can be counteracted by supporting said element by way of springs that have a comparatively low stiffness. The lower the stiffness of such a spring, the less the transfer of vibrations from the vibrating element (such as the gradient coil carrier) to the surroundings (such as the frame of the MRI apparatus) will be.

Simply supporting the gradient coil carrier by way of resilient elements, however, has some drawbacks. In particular there are still frequency ranges in which the vibrations of the gradient coil carrier still are such that they have disturbing effects.

SUMMARY OF THE INVENTION

It is an object of the invention to provide an MRI apparatus of the kind set forth in which the adverse effects of vibrations of the gradient coil carrier are counteracted better. To achieve this, the MRI apparatus in accordance with the invention is characterized in that each of the suspension elements is provided with an active drivable element that is connected in series with the resilient element. The invention is based on the recognition of the fact that an adequate reduction of the adverse effects of vibrations of the gradient coil carrier cannot be achieved merely by means of passive elements (that is, elements whose mechanical behavior responds exclusively to the static or dynamic load exerted thereon). When an active drivable element is inserted in the suspension elements, the drivable element in the suspension of the gradient coil carrier can be driven, via an electrical control circuit, in conformity with the special requirements that may be imposed on the design of an MRI apparatus in respect of vibration behavior.

A very weak suspension of the gradient coil carrier in conformity with the present state of the art notably has the drawback that in operation such a suspension may cause a change of position of the gradient coil carrier in a macroscopic sense; in other words, it may be that the gradient coil carrier is displaced in the same way as a rigid member. In dependence on the method of suspension of the gradient coil carrier, this displacement may become manifest, for example, as a macroscopic rotation of the gradient coil carrier or as a swinging movement on the suspension elements on which the gradient coil carrier bears. This drawback occurs notably in the case of a design that aims to realize an as weak as possible suspension with a view to achieving maximum vibration isolation. A macroscopic change of position means that during the acquisition of the MRI image the gradient fields are shifted relative to the object to be imaged; evidently, such a shift will have an adverse effect on the image quality. In order to counteract macroscopic displacements of the gradient coil carrier, an embodiment of the MRI apparatus in accordance with the invention is provided with a drive circuit that is arranged to drive the active drivable elements in such a manner that these elements neutralize the net forces acting on the gradient coil carrier. This aspect of the invention is based on the following insight. Vibrations of the gradient coil carrier are caused by the gradient currents in the steady magnetic field (the so-called main field) of the MRI apparatus. When the main field has the same strength and the same direction throughout the vicinity of the gradient coil carrier, the gradient coil carrier will not be subject to a net Lorentz force. However, because the main field is never homogeneous in practical circumstances, there will always be a net Lorentz force that causes the macroscopic vibrations and associated displacements. Such vibrations have a frequency that is typically of the order of magnitude of 10 Hz. When the active drivable elements are driven in such a manner that they deliver forces that are equal to and oppose said net forces, on balance no net forces will act on the gradient coil carrier any longer, so that macroscopic displacements can no longer occur either. Force compensation is thus applied in order to achieve this effect of elimination of the macroscopic displacements.

A further embodiment of the MRI apparatus in accordance with the invention is provided with a drive circuit that is arranged to drive the active drivable elements in such a manner that each of these elements compensates the vibration displacements performed by the gradient coil carrier at the area of the point of attachment of the relevant suspension element. This aspect of the invention is based on the following insight. The gradient carrier has at least one internal resonance frequency. For these resonance frequencies (the most important of which has a frequency that is typically of the order of magnitude of 700 Hz) the weak suspension constitutes an inadequate vibration isolation from the environment. This means that the transfer of vibrations that are produced by the gradient coil carrier to the environment (the frame of the MRI apparatus) is insufficiently reduced, so that the annoying noise is transferred to the further environment via the frame. This transfer is counteracted in that the active drivable element can be driven in such a manner that the displacement of the point of attachment of the suspension element to the gradient coil carrier, caused by the relevant vibrations, is compensated by an oppositely directed extension/shortening of the active drivable element that is caused by a change of the length of the drivable element that is induced by the driving. As a result, the suspension element is virtually weakened for the drive frequency (frequencies), notably for the stated typical value of 700 Hz. Such virtual weakening reduces the transfer of the dynamic forces that would be exerted on the frame of the MRI apparatus by the gradient coil carrier. Thus, displacement compensation is applied in order to achieve the effect of elimination of the transfer of forces from the gradient coil to the frame.

In order to realize (electronic) control with the desired characteristics, that is, force neutralization for low frequencies (with the result that macroscopic displacements are eliminated) and/or displacement compensation for higher frequencies (with the result that the transfer of force is prevented), an embodiment of the MRI apparatus in accordance with the invention is provided with a gradient control circuit for producing the gradient signal, the drive circuit in said apparatus being provided with a feedforward circuit that is connected between the gradient control circuit and the active drivable element. This embodiment advantageously utilizes the a priori knowledge concerning the state of vibration of the gradient coil carrier. This knowledge is derived from (the control signal for) the gradient currents in such a manner that a drive signal is generated for the active drivable element such that the desired force neutralization for low frequencies and/or the desired displacement compensation for higher frequencies are achieved.

The drive circuit in a further embodiment of the apparatus in accordance with the invention includes a feedback circuit that is arranged between a vibration sensor, provided at the area of the relevant point of attachment of the gradient coil carrier, and the active drivable element. Even though in theory the undesirable vibration of a given frequency can be adjusted to zero by means of feedforward control, in practical circumstances the result may be inadequate, for example, because the transfer of the relevant components is not accurately known or because it has changed in the course of time. In such cases the undesirable vibration can be advantageously measured by means of a vibration sensor so as to try and adjust it to zero by means of a feedback circuit. In practical circumstances this approach may offer a result that is equivalent to or even better than that of feedforward control. In this context a vibration sensor is to be understood to mean a sensor that picks up a characteristic vibration quantity, for example, a force sensor or a displacement sensor.

BRIEF DESCRIPTION OF THE DRAWINGS

The invention will be described in detail hereinafter with reference to the Figures. Therein.

DETAILED DESCRIPTION OF THE PRESENTLY PREFERRED EMBODIMENTS

Figure 1:
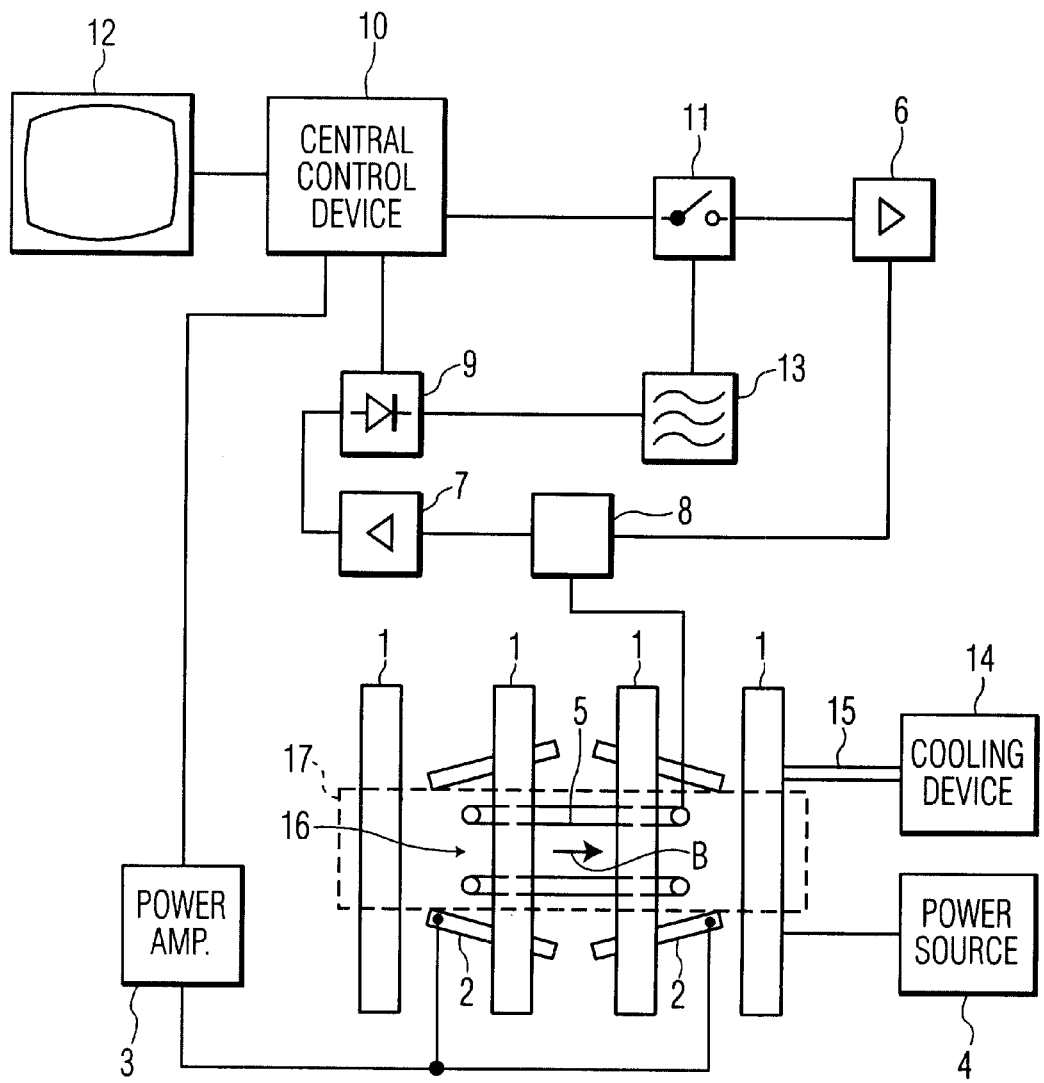
FIG. 1 is a diagrammatic representation of the general construction of a known magnetic resonance apparatus.

The magnetic resonance apparatus that is diagrammatically shown in FIG. 1 includes a first magnet system 1 for generating a steady magnetic field B, a second magnetic system 2 (the gradient coil system) for generating magnetic gradient fields, a power amplifier 3 for the gradient coil system 2 and a power supply source 4 for the first magnet system 1. An RF coil 5 serves to generate an RF magnetic alternating field; to this end, it is connected to an RF transmitter device which includes an RF source 6. The RF coil 5 can also be used for the detection of spin resonance signals that are generated in an object to be examined (not shown) by the RF transmission field; to this end, the RF coil is connected to an RF receiving device which includes a signal amplifier 7. The output of the signal amplifier 7 is connected to a detector circuit 9 that is connected to a central control device 10. The central control device 10 also controls a modulator 11 for the RF source 6, the power amplifier 3 and a monitor 12 for display. An RF oscillator 13 controls the modulator 11 as well as the detector 9 that processes measuring signals. A cooling device 14 with cooling ducts 15 is provided for cooling the magnet coils of the first magnet system 1. The RF coil 5 that is arranged within the magnet systems 1 and 2 encloses a measuring space 16 that, in the case of an apparatus for medical diagnostic measurements, is large enough to receive a patient to be examined or a part of a patient to be examined, for example the head and the neck. A steady magnetic field B, gradient fields that select object slices, and a spatially uniform RF alternating field can thus be generated in the measuring space. The RF coil 5 can combine the functions of transmitter coil and measuring coil; in that case a separating circuit 8 is provided to separate the forward signal traffic and the return signal traffic. It is alternatively possible to use different coils for the two functions; for example, surface coils can then be used as measuring coils. If desired, the coil 5 may be enclosed by a Faraday cage 17 that shields RF fields.

Figure 2:
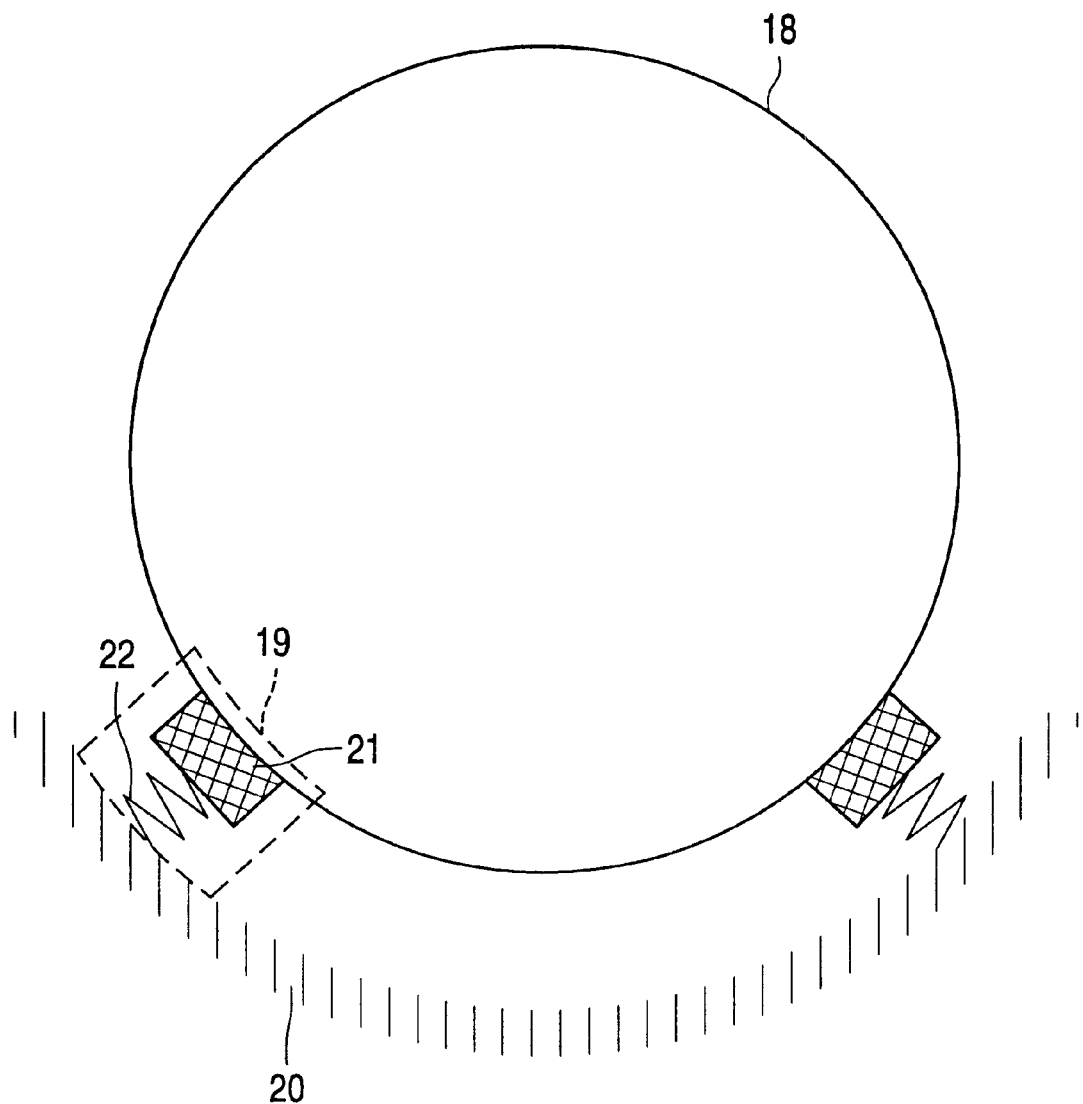
FIG. 2 is a diagrammatic representation of a carrier for a gradient coil system that is supported by suspension elements with an active drivable element.

FIG. 2 is a diagrammatic representation of a carrier for a gradient coil system that is supported by suspension elements provided with an active drivable element. The gradient coil carrier 18 customarily has the shape of a cylinder, even though other shapes are also feasible. The gradient coil carrier 18 is shown in a front view, meaning that the axis of symmetry of the cylinder extends perpendicularly to the plane of drawing. The gradient coil carrier 18 is supported by a number of suspension elements 19, two of which are shown in the Figure. The suspension elements bear directly or indirectly on the frame of the MRI apparatus that is assumed to be in the rest state. In the case of an MRI apparatus that includes a superconducting first magnet system 1 with a cryostat, the suspension elements 19 bear on the cryostat enclosure 20.

Each of the suspension elements 19 includes a resilient element 22 that may be constructed as a metal spring or as an air spring. The stiffness of the resilient element 22 is chosen to be as low as possible, so that the eigenfrequency of the system formed by the gradient coil carrier and the rubber block is much lower than the frequencies of the vibrations to be isolated that are typically of the order of magnitude of 700 Hz. As is known, vibrations of a frequency that is much higher than said eigenfrequency are transferred to the frame in damped form only. An active drivable element 21 is connected in series with the resilient element 22. Any known construction can be used for said drivable element 21, for example, a magnetostrictive actuator. However, preference is given to a piezo actuator because it has a simple and compact construction. Moreover, the piezo actuator has practically no effect on the magnetic fields that are produced in the gradient coil carrier by the MRI apparatus.

As a result of the choice for a low stiffness of the resilient element 22, the gradient coil carrier 18 may exhibit macroscopic displacements that have an adverse effect on the imaging quality of the MRI apparatus. The invention offers a solution to this problem by compensating the net forces that act on the gradient coil carrier and cause the macroscopic displacement, that is, by driving the piezo actuator in such a manner that the resultant net force on the gradient coil carrier becomes zero and hence said displacements no longer occur. The described effect is achieved in that the piezo actuator compresses and expands the spring with which it is connected in series; such shortening and extension exerts a force on the gradient coil carrier that compensates the (Lorentz) forces originally acting on the gradient coil carrier.

Figure 3A:
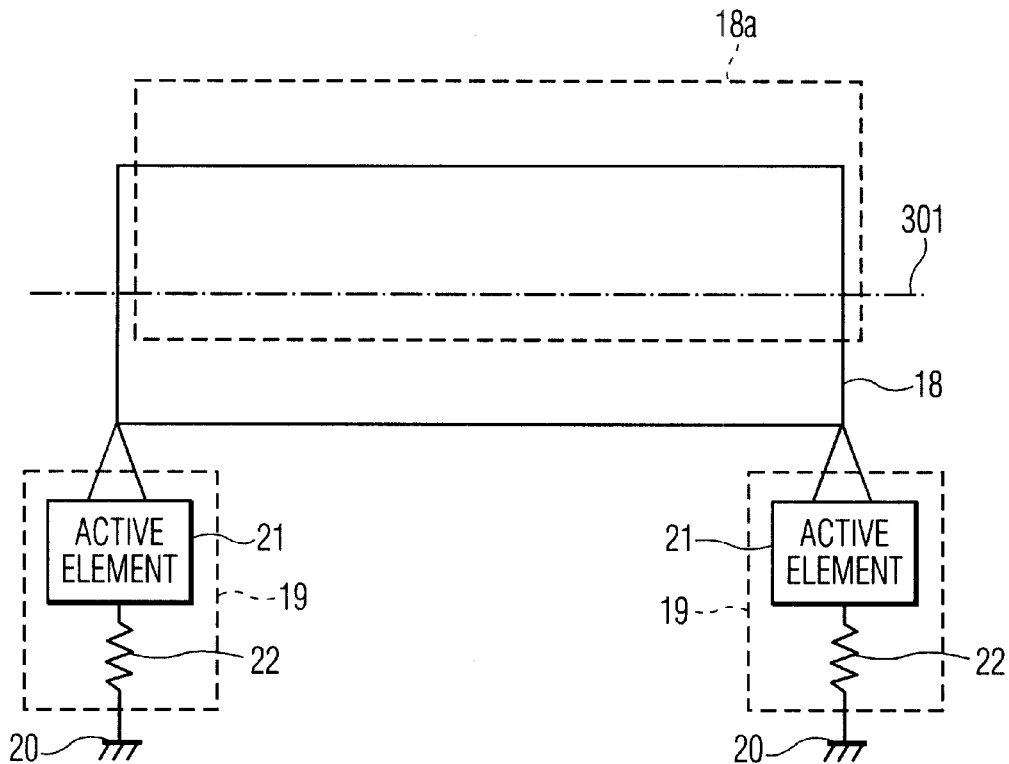
FIGS. 3a and 3b illustrate diagrammatically the vibration behavior of the gradient coil carrier.
Figure 3B:
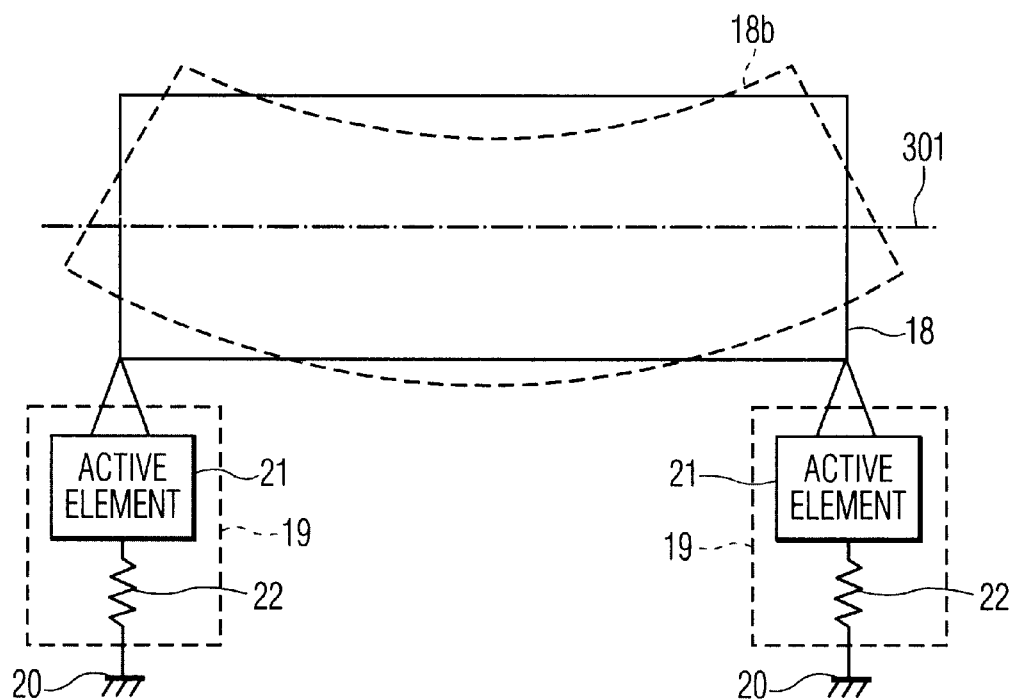

The FIGS. 3a and 3b diagrammatically illustrate the vibration behavior of the gradient coil carrier. Both Figures show (in a two-dimensional representation) the gradient coil carrier 18 in a side elevation, meaning that the symmetry axis 301 of the cylindrical gradient coil carrier is situated in the plane of drawing. In this two-dimensional representation the gradient coil carrier 18 bears on two vertically arranged suspension elements 19 which, therefore, enclose an angle of 90 degrees relative to the cylinder axis 301.

FIG. 3a shows the low-frequency mode of vibration of the gradient coil carrier 18. Under the influence of net forces that act on the gradient coil carrier, the gradient coil carrier may be subject to a vibratory motion as a rigid body, that is, without deformation taking place. In the present example the gradient coil carrier is displaced mainly in the vertical direction while the suspension elements 19 contract and expand relative to their bearing point 20. Because the frequency of this mode of vibration is typically of the order of magnitude of 10 Hz, this mode is referred to as low-frequency vibration. The displacement that is due to said low-frequency vibration is denoted by a dashed line 18a in FIG. 3a. The occurrence of a displacement of this kind during the acquisition of an MRI image has an adverse effect on the imaging quality of the MRI apparatus. The invention offers a solution to this problem. A control diagram for driving the piezo actuator so as to counteract such low-frequency vibrations will be described with reference to FIG. 4.

FIG. 3b shows the high-frequency mode of vibration of the gradient coil carrier 18. The gradient coil carrier is subject to deforming vibrations under the influence of Lorentz forces that act inside the gradient coil carrier; these vibrations do not give rise to macroscopic displacement but to deformation of the gradient coil carrier. The frequency of the principal mode of vibration for such deforming vibrations is typically of the order of magnitude of 700 Hz; therefore, this mode of vibration is referred to as high-frequency vibration. The deformation that is due to such high-frequency vibration is denoted by a dashed line 18b in FIG. 3b; because of its shape such a mode of vibration is known as the "banana mode". If no further steps are taken, this vibration mode causes vibrations in the frame of the MRI apparatus that produce an annoying noise. The invention counteracts the transfer of such vibrations by realizing displacements by means of the piezo actuator 21 in such a manner that the displacements of the point of attachment of the suspension element 19 are compensated, that is, by equally large contractions and expansions of the piezo actuator. A control diagram for driving the piezo actuator so as to counteract such high-frequency vibrations will be described with reference to FIG. 5.

Figure 4:
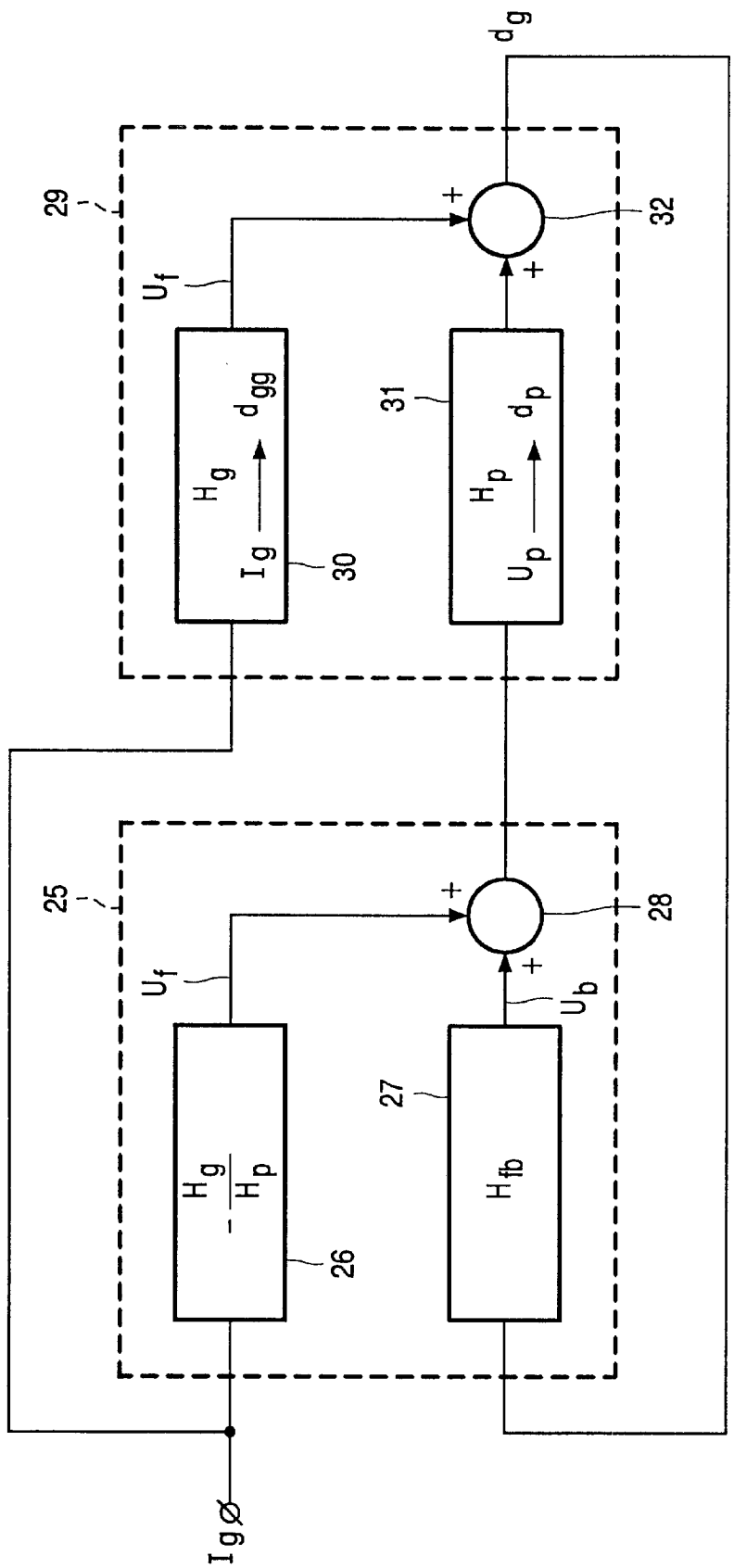
FIG. 4 shows a block diagram illustrating the control behavior of the driving of an active drivable element for low frequencies.

FIG. 4 shows a block diagram that illustrates the control behavior of the driving of an active drivable element for low frequencies, that is, frequencies of the order of magnitude of 10 Hz. Such driving utilizes feedforward as well as feedback control. In this case feedforward control is to be understood to mean in this case a form of driving where the vibration behavior of the gradient coil carrier is predicted in such a manner that the sum of the net forces acting on the gradient coil carrier becomes zero. Such a prediction is possible because the signal that drives the gradient coils, and hence causes vibration thereof, is known in advance. In this case feedback control is to be understood to mean a form of driving where the vibration behavior of the gradient coil carrier is measured by means of a vibration sensor that is arranged at the area of the point of attachment of the gradient coil carrier, so that the vibrations thus measured can be controlled so as to be practically zero.

The block diagram that is shown in FIG. 4 includes a controller block 25 which represents the combined effect of the feedforward control and the feedback control, and a processor block 29 which is a representation of the process on which the control quantities have an effect. The controller block 25 includes a feedforward controller 26 and a feedback controller 27. The output signals of the two controllers 26 and 27 are added in an adder 28 and the result thereof is applied to an input of the processor block 29.

The processor block 29 includes two blocks 30 and 31; the block 30 represents the response of the gradient coil carrier 18 to the gradient signal and the block 31 represents the response of the piezo actuator 21 to the voltage applied thereto. The output signals of the two controllers 30 and 31 are added in an adder 32 and the result thereof is fed back to the input of the feedback controller 27. The contents of the feedback controller 27 are dependent to a high degree on the process in which the controller acts, that is, on the actual appearance of the MRI apparatus in which the controller is used. The design of such a controller on the basis of the specifications of the MRI apparatus, however, will not require undue effort from a person who is skilled in the art. The contributions by the process blocks 30 and 31 can be assumed to be added so as to form a resultant vibration that is measured by a vibration sensor (not shown) whose output signal is applied to the processor 27.

A signal that represents the gradient current $l_g$ is applied to the input of the feedforward controller 26 and also to the input of the block 30. The output of the block 30 represents the displacement of the relevant point of the gradient coil carrier under the influence of the input signal $I_g$. The feedforward controller 26 predicts, on the basis of the input signal $l_g$, the (negative value of the) latter displacement and translates it into a voltage $U_f$ that makes the piezo actuator induce said displacement. This prediction may not be completely correct in practical circumstances. The macroscopic displacement $d_g$ measured on the gradient coil carrier is fed back to the input of the feedback controller 27 which converts this displacement error into an appropriate control voltage $U_b$ for the piezo actuator. The signals $U_f$ and $U_b$ are added in the adder 28 so as to form a signal $U_p$ and this sum is applied to the actuator as represented by the block 31. The displacement $d_p$ by the piezo actuator 21, as represented at the output of the block 31, and the displacement $d_{gg}$ of the non-controlled gradient coil carrier 18, as represented at the output of the block 30, are added in the adder 32 so as to form the ultimate low-frequency displacement $d_g$ of the gradient coil carrier which is thus controlled so as to be zero in the case of ideal circumstances.

Figure 5:
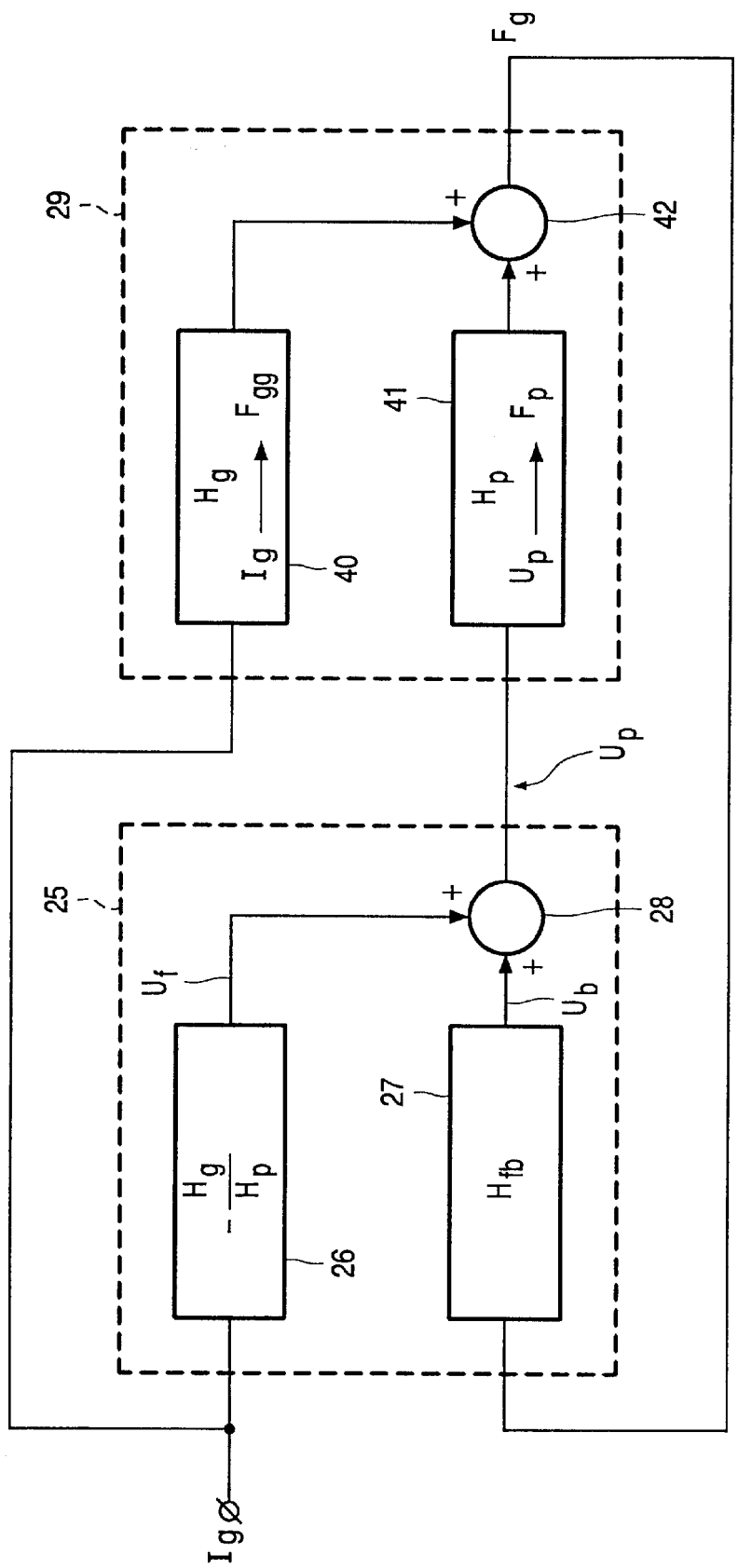
FIG. 5 is a block diagram that illustrates the control behavior of the driving of an active drivable element for high frequencies.

FIG. 5 shows a block diagram that illustrates the control behavior of the driving of an active drivable element for high frequencies, that is, frequencies of the order of magnitude of 700 Hz. The configuration of the block diagram that is shown in FIG. 5 is similar to that of the block diagram that is shown in FIG. 4. The functionality thereof deviates from the functionality that is shown in FIG. 4 in that in the block 40, corresponding to the block 30, the gradient signal $I_g$ is converted into a force $F_{gg}$, whereas in the block 41, corresponding to the block 31, the control voltage $U_p$ for the piezo actuator 21 is also converted into a force $F_p$. The functionality of the block diagram that is shown in FIG. 5 corresponds to that of FIG. 4 to a high degree; therefore, the operation of FIG. 5 will not be described in detail, be it that in FIG. 5 displacements at the outputs of the blocks 30 and 31 in FIG. 5 have been replaced by forces $F_{gg}$ and $F_p$ and that a signal that is a measure of the residual force $F_g$ exerted on the frame 20 by the gradient coil carrier is fed back to the input of the feedback controller 27. The ultimate net high-frequency force $F_g$ that is exerted on the gradient coil carrier then appears at the output of the adder 42; this is the force that is controlled so as to be zero in the case of ideal circumstances.

Figure 6:
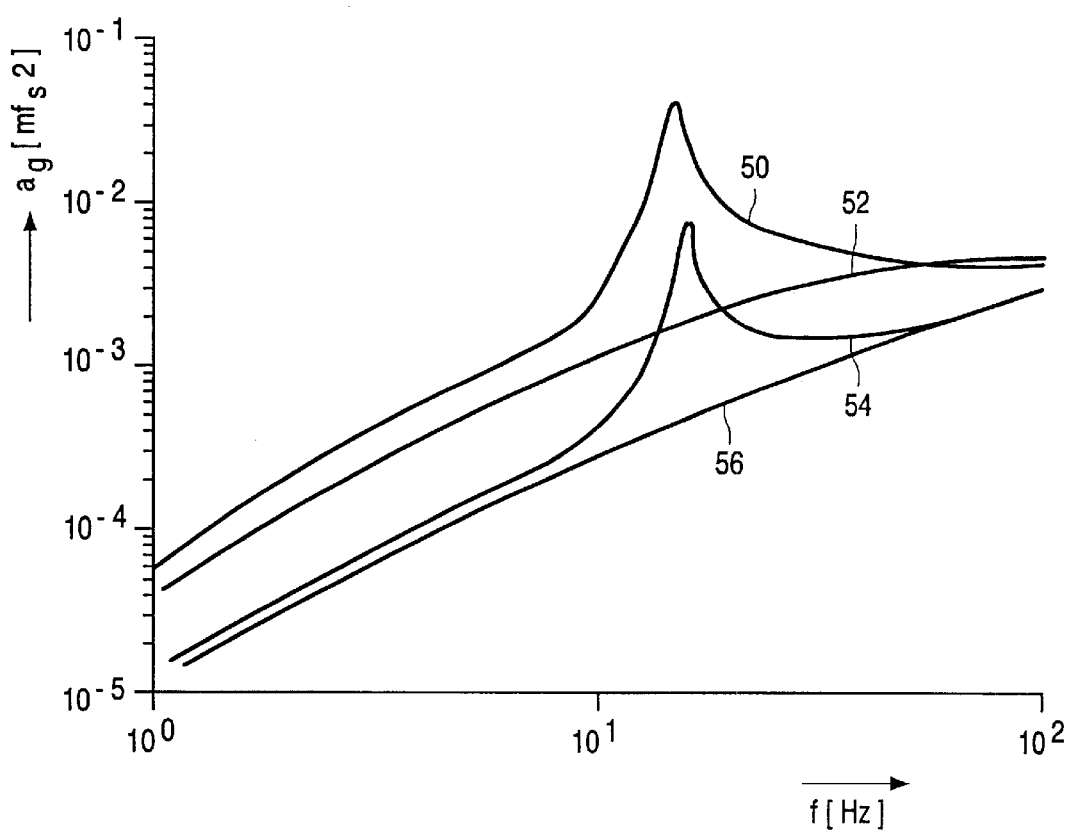
FIG. 6 is a graphic representation of the low-frequency vibration behavior of the gradient coil carrier with and without utilizing the invention.

FIG. 6 is a graphic representation of the low-frequency vibration behavior of the gradient coil carrier, that is, with and without making use of the invention. The transfer of the low-frequency vibrations is plotted on the vertical axis (that is, the acceleration $a_g$ of the gradient coil carrier per unit of net force that is exerted on the gradient coil carrier) and the frequency of the vibrations is plotted on the horizontal axis. The graph shows four curves, that is, the curves 50, 52, 54 and 56.

The curve 50 represents said transfer in the absence of control in accordance with the invention (in the FIGS. 4 and 5 this would mean that only the blocks 30 and 40, respectively, would be present); however, the gradient coil carrier is suspended from the frame of the MRI apparatus by way of very weak resilient elements. This Figure clearly shows the strong (low-frequency) transfer at approximately 13 Hz.

The curve 52 represents said transfer in the absence of feedforward control, but in the presence of feedback control in accordance with the invention. This Figure illustrates that the strong low-frequency transfer at approximately 13 Hz has disappeared practically completely, but that the transfer at the other frequencies has not been significantly improved.

The curve 54 illustrates said transfer in the presence of feedforward control but in the absence of feedback control in accordance with the invention. This Figure shows that the vibration transfer is strongly reduced (by a reduction factor of approximately 4) throughout the frequency range between 0 and 100 Hz, and that the strong low-frequency transfer at approximately 13 Hz has been reduced; a further reduction of this low-frequency transfer at approximately 13 Hz is still desirable.

The curve 56 shows said transfer in the presence of feedforward control as well as feedback control in accordance with the invention. This Figure shows that the vibration transfer has been reduced even more (by a reduction factor of approximately 1.5) throughout the frequency range between 0 and 100 Hz and that, moreover, the strong low-frequency transfer at approximately 13 Hz has completely disappeared. The latter curve clearly demonstrates the effectiveness of the steps proposed in accordance with the invention.

What is claimed is:

1. An apparatus for forming magnetic resonance images, which apparatus comprises:
    a gradient coil system that is comprised of a gradient coil carrier on which gradient coils are arranged, said gradient coil carrier being attached to a frame of the apparatus by way of suspension elements, each of which is provided with a resilient element;
    wherein each of the suspension elements is provided with an active drivable element that is connected in series with the resilient element.

2. An apparatus as claimed in claim 1, further comprising a drive circuit arranged to drive the active drivable elements in such a manner that these elements neutralize the net forces that act on the gradient coil carrier.

3. An apparatus as claimed in claim 1, further comprising a drive circuit arranged to drive the active drivable elements in such a manner that each of said elements compensates the vibration displacements effected in the gradient coil carrier at the area of the point of attachment of the relevant suspension element.

4. An apparatus as claimed in claim 2 or 3, further comprising a gradient control circuit for producing the gradient signal, the drive circuit comprising a feedforward circuit connected between the gradient control circuit and the active drivable element.

5. An apparatus as claimed in one of claims 2, 3, or 4, in which the drive circuit further comprises a feedback circuit arranged between a vibration sensor, provided at the area of the relevant point of attachment of the gradient coil carrier, and the active drivable element, wherein the feedback circuit receives a signal from the feedback circuit.

6. An apparatus as claimed in one of the preceding claims, in which the active drivable element is formed by a piezo actuator.

7. A gradient coil system in an apparatus for forming magnetic resonance images, said gradient coil system comprising:
    a gradient coil carrier on which gradient coils are arranged;
    a gradient control circuit for producing a gradient signal for the gradient coil carrier; and
    a plurality of suspension elements for attaching the gradient coil carrier to a frame of the apparatus, each of said plurality of suspension elements being comprised of:
        a resilient element;
        an active drivable element that is connected in series with the resilient element; and
        a drive circuit for driving the active drivable element, said drive circuit being provided with a feedforward circuit which receives the gradient signal and predicts a negative value of a displacement in the gradient coil carrier caused by the gradient signal.

8. A gradient coil system in an apparatus for forming magnetic resonance images, said gradient coil system comprising:

a gradient coil carrier on which gradient coils are arranged; and a plurality of suspension elements for attaching the gradient coil carrier to a frame of the apparatus, each of said plurality of suspension elements being comprised of:

a resilient element;

a vibration sensor provided at a point of attachment of the suspension element on the gradient coil carrier;

an active drivable element that is connected in series with the resilient element; and a drive circuit for driving the active drivable element, said drive circuit being provided with a feedback circuit which receives a displacement signal from the vibration sensor and converts the received displacement signal into an appropriate control signal for the active drivable element.

* * * * *